US008147994B2

(12) United States Patent
Matsuzawa et al.

(10) Patent No.: US 8,147,994 B2
(45) Date of Patent: Apr. 3, 2012

(54) LAYERED STRUCTURE HAVING FEPT SYSTEM MAGNETIC LAYER AND MAGNETORESISTIVE EFFECT ELEMENT USING THE SAME

(75) Inventors: Hironobu Matsuzawa, Tokyo (JP); Tsutomu Chou, Tokyo (JP)

(73) Assignee: TDK Corporation, Tokyo (JP)

( * ) Notice: Subject to any disclaimer, the term of this patent is extended or adjusted under 35 U.S.C. 154(b) by 565 days.

(21) Appl. No.: 12/379,632

(22) Filed: Feb. 26, 2009

(65) Prior Publication Data

US 2010/0214696 A1 Aug. 26, 2010

(51) Int. Cl.
*G11B 5/39* (2006.01)
*G11B 5/127* (2006.01)

(52) U.S. Cl. ............... 428/812; 428/811.5; 428/831; 428/632; 428/681; 428/336; 360/324.12

(58) Field of Classification Search .................. None
See application file for complete search history.

(56) References Cited

U.S. PATENT DOCUMENTS

| | | | |
|---|---|---|---|
| 6,724,583 B2* | 4/2004 | Seigler et al. | 360/324.12 |
| 6,777,078 B2* | 8/2004 | Maeda et al. | 428/836.1 |
| 7,035,062 B1* | 4/2006 | Mao et al. | 360/324.2 |
| 7,177,122 B2* | 2/2007 | Hou et al. | 360/324.12 |
| 7,190,613 B2 | 3/2007 | Nagase et al. | |
| 7,446,985 B2* | 11/2008 | Lee et al. | 360/324.12 |
| 7,869,165 B2 | 1/2011 | Miyauchi et al. | |
| 7,916,429 B2* | 3/2011 | Miyauchi et al. | 360/319 |
| 7,978,439 B2 | 7/2011 | Zhang et al. | |
| 2007/0064352 A1* | 3/2007 | Gill | 360/324.11 |
| 2008/0316657 A1* | 12/2008 | Zhang et al. | 360/324.11 |
| 2010/0159283 A1* | 6/2010 | Ibusuki et al. | 428/829 |

FOREIGN PATENT DOCUMENTS

| | | |
|---|---|---|
| JP | A-H10-275722 | 10/1998 |
| JP | A-2001-210989 | 8/2001 |
| JP | A-2002-216330 | 8/2002 |
| JP | A-2003-51411 | 2/2003 |
| JP | A-2003-313659 | 11/2003 |
| JP | A-2004-348851 | 12/2004 |
| JP | A-2005-19464 | 1/2005 |
| JP | A-2005-285207 | 10/2005 |
| JP | A-2009-4784 | 1/2009 |
| JP | A-2009-32382 | 2/2009 |

OTHER PUBLICATIONS

Machine Translation of JP 2005-285207 A (pub 2005).*
Machine Translation of JP 2004-348851 A (pub. 2004).*
Yingguo Peng, Jian-Gang Zhu, and David E. Laughlin, "$L1_0$ FePt-MgO perpendicular thin film deposited by alternating sputtering at elevated temperature," *Journal of Applied Physics*, vol. 99, Issue 8 pp. 08F907-08F907-3 (Apr. 26, 2006).

* cited by examiner

Primary Examiner — Kevin Bernatz
(74) Attorney, Agent, or Firm — Posz Law Group, PLC

(57) ABSTRACT

A layered structure includes an amorphous Ta layer, a metallic oxide layer formed from zinc oxide (ZnO) or magnesium oxide (MgO) on the Ta layer, and a FePt magnetic layer formed on the metallic oxide layer. Therefore, an $L1_0$ structural FePt ordered alloy is obtained at a temperature of 300° C. or lower.

13 Claims, 14 Drawing Sheets

LAYERED STRUCTURE HAVING FEPT SYSTEM MAGNETIC LAYER AND MAGNETORESISTIVE EFFECT ELEMENT USING THE SAME

BACKGROUND OF THE INVENTION

1. Field of the Invention

The present invention relates to a layered structure that has a FePt system magnetic layer (hereinafter as FePt magnetic layer). Particularly, the present invention relates to a layered structure that is able to decrease an ordered temperature for a FePt alloy equal to or below 300° C., and to realize a high coercive force. The layered structure that has the FePt magnetic layer according to the present invention is used, for example, as a hard magnet for a bias magnetic field application of a magnetoresistive effect (MR) element, a microwave assist recording oscillation element, and a next generation magnetic recording medium.

2. Description of the Related Art

An $L1_0$ structural FePt ordered alloy with a high uniaxial crystalline magnetic anisotropy is noted as a next generation ultra high density magnetic recording medium material because the alloy includes a minute nano-size particle maintains ferromagnetic characteristics.

The FePt ordered alloy is also expected to be used as a magnet because it has a high uniaxial crystalline magnetic anisotropy. A FePt also has merits in that it is superior in corrosion resistance and resistance to oxidation compared to rare earth metals, such as Nd and Sm.

The $L1_0$ structural FePt ordered alloy is stable in view of thermodynamics at room temperature. However, a FePt layer, which is formed by a sputtering method, cannot be transformed (crystal-ordered) into the ordered structure because it does not pass through the ordered-random transformation point that exists at a high temperature during the forming layer process. Therefore, in order to obtain the $L1_0$ ordered structure, it is necessary to conduct the following high temperature processes, typically, at over 500° C.; forming a layer on a heated base, or annealing a random alloy thin layer after layer formation.

However, structural materials used, for example, as a hard disk device with a thin film magnetic head, have a temperature tolerance only up to about 300° C., and do not have a tolerance for high temperature processes over 500° C. Therefore, it is expected to provide a layered structure with a FePt magnetic layer that has an $L1_0$ structural FePt ordered alloy formed equal to or below 300° C.

Related art that especially relates to a layered structure of the present invention is Japanese laid-open patent publication number JP2003-313659. This related art discloses that a seed layer, a base layer, and an $L1_0$ ordered alloy are formed in this order on a supporting substrate. This related art also describes that the ordered temperature is controlled by residual oxygen concentration regardless of base materials; therefore, its specific structure and operation are different from that of the present invention.

The present invention is provided under these actual circumstances. The object of the present invention is to provide a layered structure with a FePt magnetic layer that has an $L1_0$ structural FePt ordered alloy formed equal to or below 300° C.

SUMMARY OF THE INVENTION

In order to resolve the above mentioned problems, the layered structure according to the present invention is provided to have the following structure: an amorphous Ta layer; a metallic oxide layer formed from one of zinc oxide (ZnO) and magnesium oxide (MgO) on the Ta layer; and a FePt magnetic layer formed on the metallic oxide layer.

In a preferred embodiment of the layered structure according to the present invention, a main component of the FePt magnetic layer is an $L1_0$ structural FePt ordered alloy.

In a preferred embodiment of the layered structure according to the present invention, the FePt magnetic layer has a material characteristic that is a coercive force of equal to or over 6,000 Oe.

In a preferred embodiment of the layered structure according to the present invention, after the FePt magnetic layer is formed, it is annealed at a temperature equal to or below 300° C.

In a preferred embodiment of the layered structure according to the present invention, after the FePt magnetic layer is formed, it is annealed at a temperature between 200-300° C.

In a preferred embodiment of the layered structure according to the present invention, the layer thickness of the Ta layer is at least 2 nm, the layer thickness of the metallic oxide layer is at least 2 nm, and the layer thickness of the FePt magnetic layer is at least 10 nm.

In a preferred embodiment of the layered structure according to the present invention, the layer thickness of the Ta layer is in a range of 2-10 nm, the layer thickness of the metallic oxide layer is in a range of 2-10 nm, and the layer thickness of the FePt magnetic layer is in a range of 10-50 nm.

In a preferred embodiment of the layered structure according to the present invention, the FePt magnetic layer has at least 80 at % of the total amount of Fe and Pt atoms.

In a preferred embodiment of the layered structure according to the present invention, the FePt magnetic layer has Cu as an additive, and the content of the Cu is 5-30 at %.

The MR element according to the present invention comprises a nonmagnetic intermediate layer, and a magnetoresistive effect portion (MR portion) that has a first ferromagnetic layer as a free layer and a second ferromagnetic layer as a free layer, both of which are laminated to sandwich the nonmagnetic intermediate layer, wherein the MR element has the CPP structure in which a sense current is applied in a laminated direction of the MR portion, wherein an orthogonal bias magnet is provided at the rear portion of the MR portion where the orthogonal bias magnet has the influence on the substantial orthogonal direction status of the magnetization direction for the first and second ferromagnetic layer, and wherein the orthogonal bias magnet has the layered structure mentioned above.

The thin film magnetic head according to the present invention comprises an MR element that is provided in the vicinity of a medium opposite surface to detect a signal magnetic field from a recording medium, and a pair of electrodes that apply the electric current in the laminated direction of the MR element.

The head gimbal assembly according to the present invention comprises the above mentioned thin film magnetic head, a slider that is provided opposite to a recording medium, and a suspension that elastically supports the slider.

The magnetic disk device according to the present invention comprises the above mentioned thin film magnetic head, a slider that is provided opposite to a recording medium, and a positioning device that supports the slider and locates the position of the slider against the recording medium.

DETAILED DESCRIPTION OF THE INVENTION

A description of preferred embodiments of the present invention is provided below in detail.

The present invention relates to a layered structure that has a FePt magnetic layer. Particularly, the present invention relates to a layered structure that is able to decrease the ordered temperature for a FePt alloy equal to or below 300° C., and to have a high coercive force.

The layered structure that has the FePt magnetic layer according to the present invention is used, for example, as a hard magnet for a bias magnetic field application of an MR element, a microwave assist recording oscillation element, a next generation magnetic recording medium, and so on.

Figure 1:
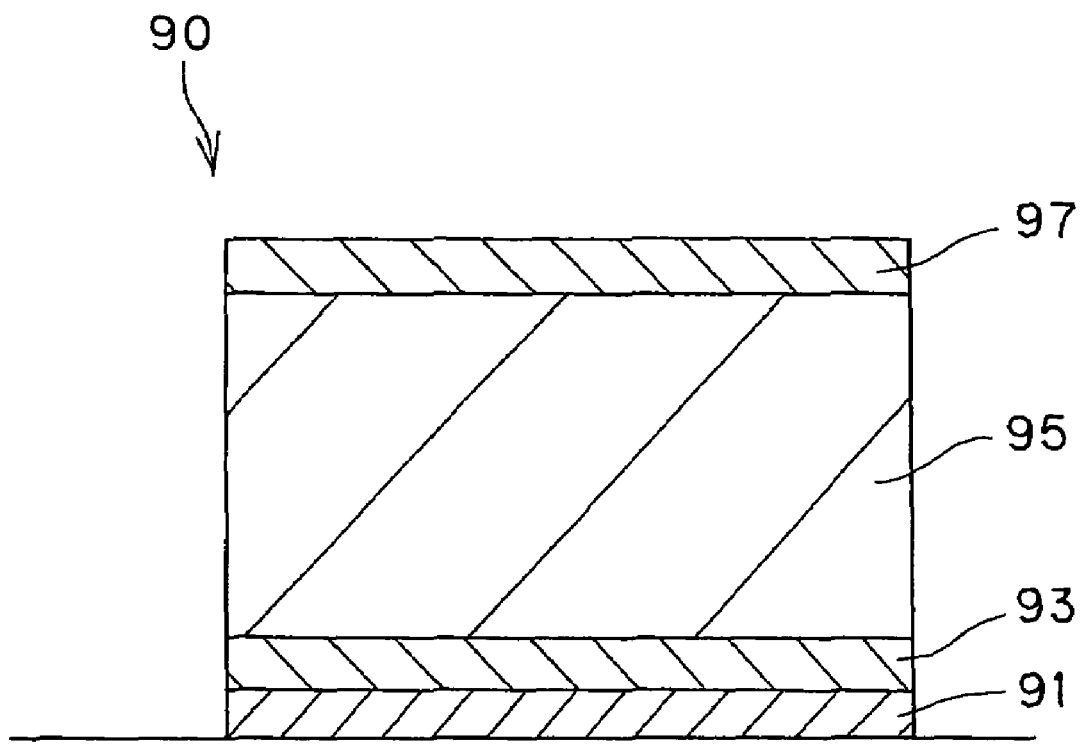
FIG. 1 is a sectional view of the layered structure with the FePt magnetic layer of the present invention.

A description of the layered structure of the present invention is given with reference to FIG. 1.

As shown in FIG. 1, a layered structure 90 is provided to have the following structure: an amorphous Ta layer 91; a metallic oxide layer 93 composed of zinc oxide (ZnO) or magnesium oxide (MgO) and formed on the Ta layer 91; and a FePt magnetic layer 95 formed on the metallic oxide layer 93. A top layer identified by reference numeral 97 is a passivation layer.

As it is understandable from the above explanation, there are mainly two specific laminated configurations for the layered structure 90. Namely, there are two kinds of the layered structure 90 as follows:

(1) Ta layer 91/ZnO metallic oxide layer 93/FePt magnetic layer 95; and (2) Ta layer 91/MgO metallic oxide layer 93/FePt magnetic layer 95.

These layered structures 90 are formed, generally, on a substrate composed, for example, of ALTIC or Si, in that order. The essential features of the present invention are described as in (1) and (2) above, and there is no restriction with the type of substrate. There is also no restriction with the type of the passivation layer 97.

Explanation of Ta Layer 91

The Ta layer 91 has a layer thickness of at least 2 nm. Preferably, the layer thickness is between 2-10 nm. More preferably, it is between 4-6 nm. If the layer thickness of the Ta layer 91 is less than 2 nm, it is difficult to obtain the effect of the present invention.

The Ta layer 91 is made of an amorphous thin layer. A combination of the Ta layer 91 and a specific metallic oxide layer 93, which is formed on the Ta layer, only can provide the synergetic effect. Namely, the special and remarkable effect of the present invention is provided with the specific combination of the two base layers. Although this is speculated, it is believed that a crystal orientation of the specific metallic oxide layer 93 (zinc oxide (ZnO) layer or magnesium oxide (MgO) layer), which has good affinity with the Ta layer 91 is improved due to the existence of the Ta layer 91.

The Ta layer 91 is formed by a sputtering method, and as mentioned above, is formed as a thin film in an amorphous state.

Explanation of Metallic Oxide Layer 93

The metallic oxide layer 93, which formed from the zinc oxide (ZnO) layer or the magnesium oxide (MgO) layer, is formed on the Ta layer 91.

The metallic oxide layer 93 has a layer thickness of at least 2 μm. Preferably, the layer thickness is between 2-10 nm. More preferably, it is between 4-6 nm. If the layer thickness of the metallic oxide layer 93 is less than 2 nm, it is difficult to obtain the effect of the present invention. As described above, it is confirmed through experimentation that only the combination of the specific metallic oxide layer 93, which is formed as a zinc oxide (ZnO) layer or a magnesium oxide (MgO) layer, and the Ta layer 91, which is formed beneath the metallic oxide layer 93, can realize the special and remarkable effect of the present invention; that is, obtaining an $L1_0$ structural FePt ordered alloy at a temperature of 300° C. or lower.

The metallic oxide layer 93 is formed by a sputtering method. It is preferable that a substrate is annealed at the temperature of approximate 250° C., or at least between the range of 200-300° C., during the sputtering. It is expected the effect that the crystallization of the metallic oxide layer 93, which is the zinc oxide (ZnO) layer or the magnesium oxide (MgO) layer, is improved because a layer is formed with annealing.

Explanation of FePt Magnetic Layer 95

The FePt magnetic layer 95 is formed on the metallic oxide layer 93.

The FePt magnetic layer 95 of the present invention is configured by the $L1_0$ structural FePt ordered alloy as a main component by the annealing process at a temperature of 300° C. or lower after forming the layer because of the existence of the combination of the Ta layer 91 and the metallic oxide layer 93 which is the zinc oxide (ZnO) layer or the magnesium oxide (MgO) layer. Therefore, the FePt magnetic layer 95 is formed with a material characteristic that is a coercive force of equal to or over 6,000 Oe (especially, 8,000-12,000 Oe).

The necessity of a coercive force of 6,000 Oe or more is discussed below.

A CoPt, which is generally used as a conventional high coercive force material, has a coercive force of about 3,000-4,000 Oe. Comparatively, the FePt has a material characteristic that is a coercive force of 6,000 Oe or more. For example, a coercive force of approximate 3,000 Oe would not be enough for an oscillating device or high coercive materials if a smaller size and high recording density are required in the future. Therefore, it is expected to use the FePt as the high coercive force material with not only over 3,000 Oe, but also 6,000 Oe or more; however, if this material is used, there are problems described in the Description of The Related Art section. Thus, the layered structure of the present invention is provided, and a coercive force of the 6,000 Oe or more is realized by the structure of the $L1_0$ structural FePt ordered alloy as the main constituent with the annealing at a temperature of 300° C. or lower.

The FePt magnetic layer 95 has a layer thickness of at least 10 nm. Preferably, the layer thickness is between 10-50 nm. More preferably, it is between 15-40 nm. If the layer thickness of the FePt magnetic layer 95 is less than 10 nm, it is difficult to proceed with the ordering of the FePt.

The FePt magnetic layer 95 is formed by a sputtering method. The FePt magnetic layer 95 has at least 80 at % of the total summation of Fe and Pt atoms. Preferably, it has 80-95 at %.

It is preferable that the FePt magnetic layer 95 has Cu as an additive, and that the content of the Cu is 5-30 at %. More specifically, it is 8-20 at %. The added Cu is dispersed among the FePt and also is aggregated so that Cu clusters are formed.

In the layered structure with the FePt magnetic layer described above, it is possible to control the magnetization direction of the FePt magnetic layer, after the layer is formed, by annealing the layer at a temperature of 300° C. or lower while the magnetic field is applied in a certain direction (namely the magnetic annealing process).

[Explanation of the Layered Structure Applied to a Bias Magnetic Field Application Magnet as MR Element]

A description of the bias magnetic field application magnet 90 (the orthogonal bias magnet 90) as the MR element of the layered structure 90 described above is given below with reference to FIGS. 2-13.

In the explanation below, a size of the X axis is defined as "width," a size of the Y axis is defined as "length," and a size of the Z axis is defined as "thickness" in each drawing.

In the Y axis direction, an area that is close to an air bearing surface (a surface of a thin film magnetic head that is opposite to a recording medium; also called ABS) is defined as "front," and an area that is opposite side of the front is defined as "rear." The laminated direction of an element is defined as "above" or "upper side," and the opposite direction is defined as "below" or "lower side."

Figure 2:
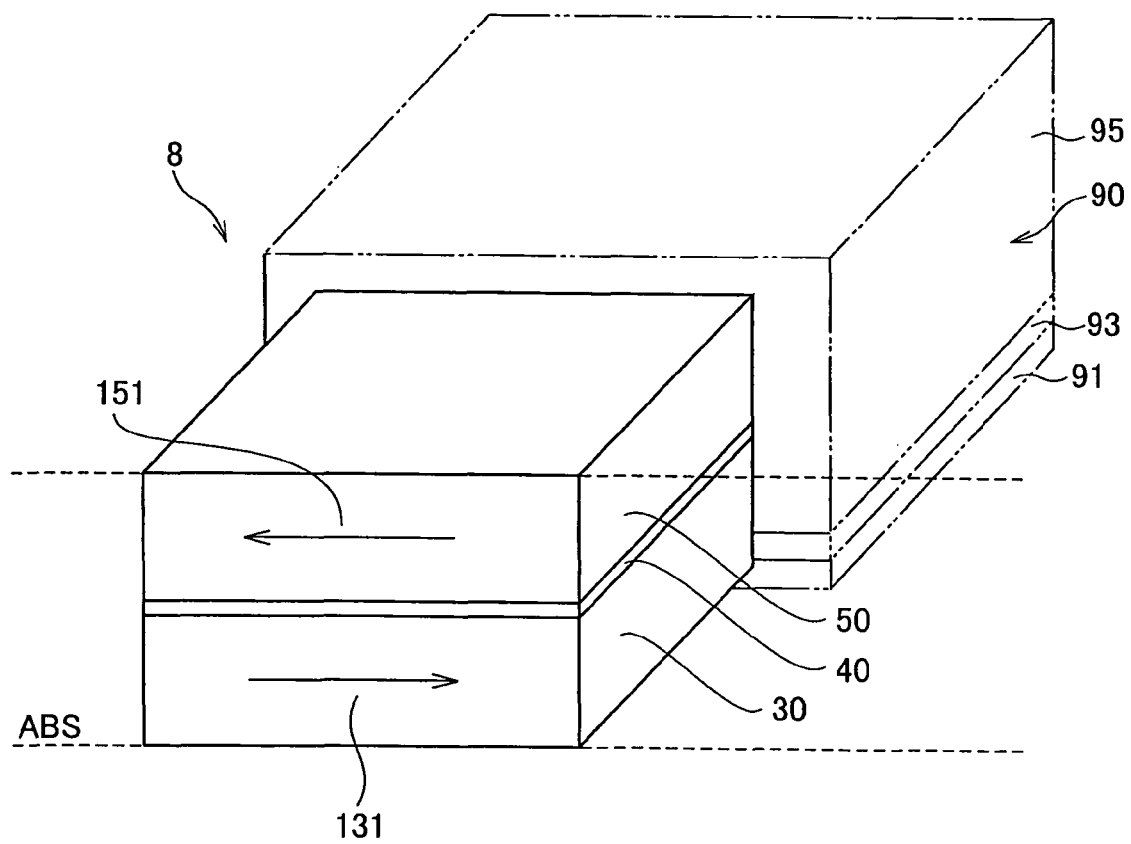
FIG. 2 is a perspective view of an application where the layered structure with the FePt magnetic layer is applied to a bias magnetic field application magnet for an MR element, and schematically shows the main parts of the MR element of the present invention.

As shown in a schematic view of FIG. 2, the MR element includes a nonmagnetic intermediate layer 40, and an MR portion 8 that has a first ferromagnetic layer 30 that functions as a free layer and a second ferromagnetic layer 50 that functions as a free layer, which are laminated to sandwich the nonmagnetic intermediate layer 40. The MR element has a current perpendicular to plane (CPP) structure in which a sense current is applied in a laminated direction of the MR portion.

Figure 3:
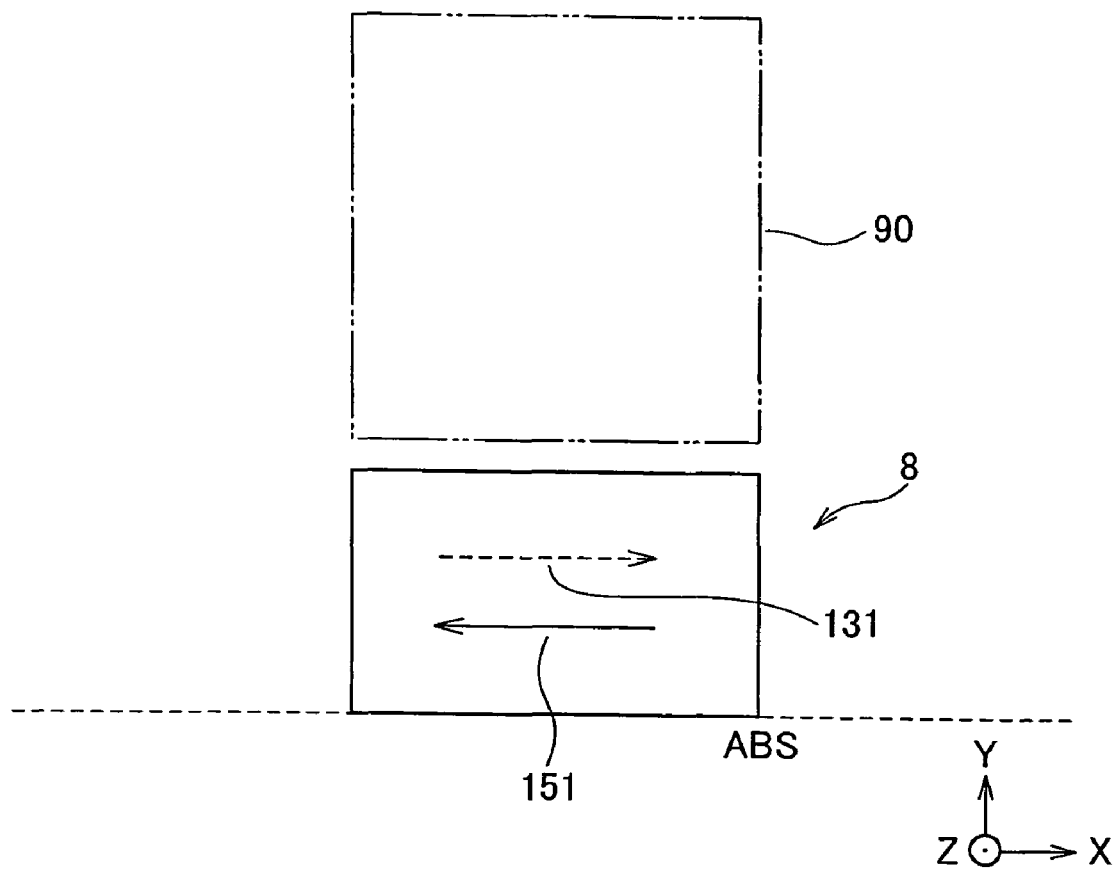
FIG. 3 is a top plan view in an X-Y plane of FIG. 2.

As shown in FIGS. 2 and 3, the orthogonal bias magnet 90 is provided at the rear portion of the MR portion 8 where the orthogonal bias magnet 90 has an influence on the substantial orthogonal direction of the magnetization direction for the first ferromagnetic layer 30 and the second ferromagnetic layer 50. In the embodiment, the orthogonal bias magnet 90 is substantially the layered structure 90 described above.

A state before the orthogonal bias magnet 90 is activated is shown in FIGS. 2 and 3. Under this state, the magnetic field that causes the orthogonal bias to the orthogonal bias magnet 90 is not generated. Therefore, in the MR element, the magnetization direction 131 of the first ferromagnetic layer 30 (the free layer 30) and the magnetization direction 151 of the second ferromagnetic layer 50 (the free layer 50) are antiparallel to each other along the track width direction (in the X axis direction in drawings).

In other words, when the magnetized operation has not been conducted for the orthogonal bias magnet 90 (for example, the layered structure with the FePt magnetic layer is annealed at a temperature of 300° C. or lower while the magnetic field is applied in a certain direction, namely the magnetic annealing process) and before it is made functional, the magnetization directions 131, 151 of the first ferromagnetic layer 30 and the second magnetic layer 50, respectively, are antiparallel to each other. There are several other methods to realize the antiparallel state of the magnetization directions 131 and 151. Those methods are described later.

Figure 4:
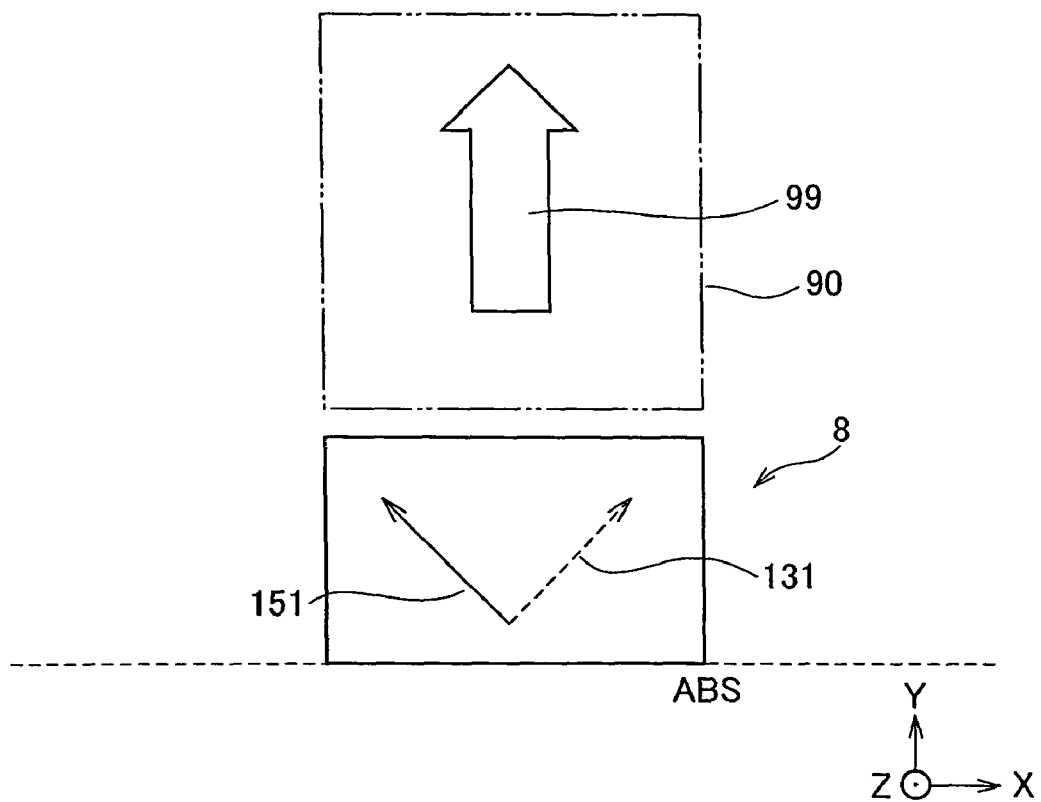
FIG. 4 is a top plan view in the X-Y plane of FIG. 2, and shows a model of the magnetic state change to obtain the MR change of the MR element in relation to the external magnetic field.

As shown in FIG. 4, the orthogonal bias magnet 90, which is provided in the rear side (the Y axis direction) of the first ferromagnetic layer 30 and the second ferromagnetic layer 50, is magnetized, for example, in the Y direction (see magnetization 99) toward the rear side from the ABS. This is called "ABS IN Magnetization." The direction of the magnetization 99 is referred to as the perpendicular direction toward the rear side from the ABS. This direction of the magnetization 99 is realized by the so-called magnetic annealing process. As mentioned above, in the process, the layered structure with the FePt magnetic layer is annealed at a temperature of 300° C. or lower while a magnetic field is applied in a certain direction. Due to this direction of the magnetization 99, the magnetization directions 131 and 151, which were antiparallel, of the first ferromagnetic layer 30 and the second ferromagnetic layer 50 are oriented in initial positions each at approximate a 45 degree angle relative to the track width direction (the X axis direction), respectively (an initial position). Therefore, the magnetization direction 131 and the magnetization direction 151 are substantially orthogonal. "Substantially orthogonal" is defined as a range of 90°±20°, where 90° is ideal.

Figure 5:
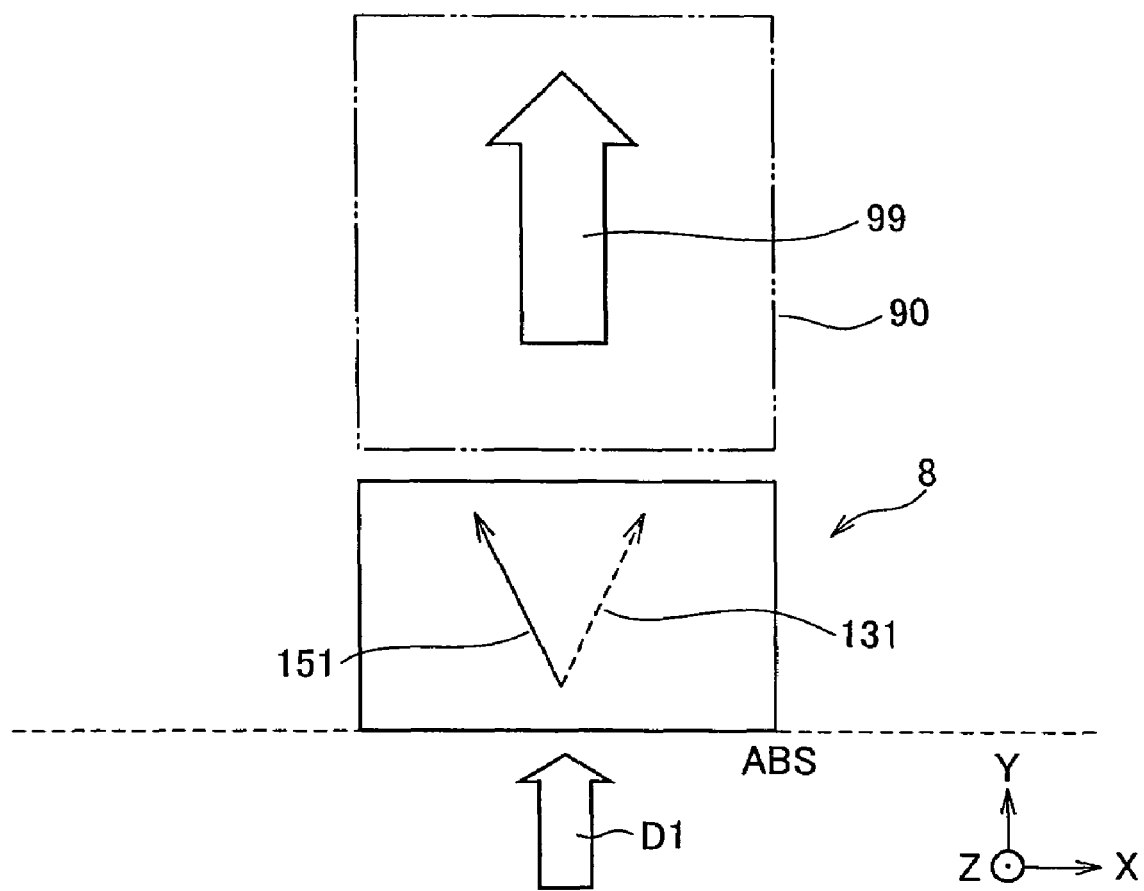
FIG. 5 is a top plan view in the X-Y plane of FIG. 2, and shows a model of the magnetic state varying according to the external magnetic field. When the magnetic state changes, the magnetoresistive effect of the MR element varies.

At a time when these two ferromagnetic layers 30, 50, which are in the above initial positions, detect a signal magnetic field from the medium, the magnetization directions change in a scissor-like manner as when scissor blades move from an open to a closed position. As a result, a resistance of the element changes. As shown in FIG. 5, when an external magnetic field D1, which flows in the direction from the ABS to the element side, is detected, the magnetization direction 131 of the first ferromagnetic layer 30 and the magnetization direction 151 of the second ferromagnetic layer 50 tend to rotate to the same direction, and the resistance of the element is decreased.

Figure 6:
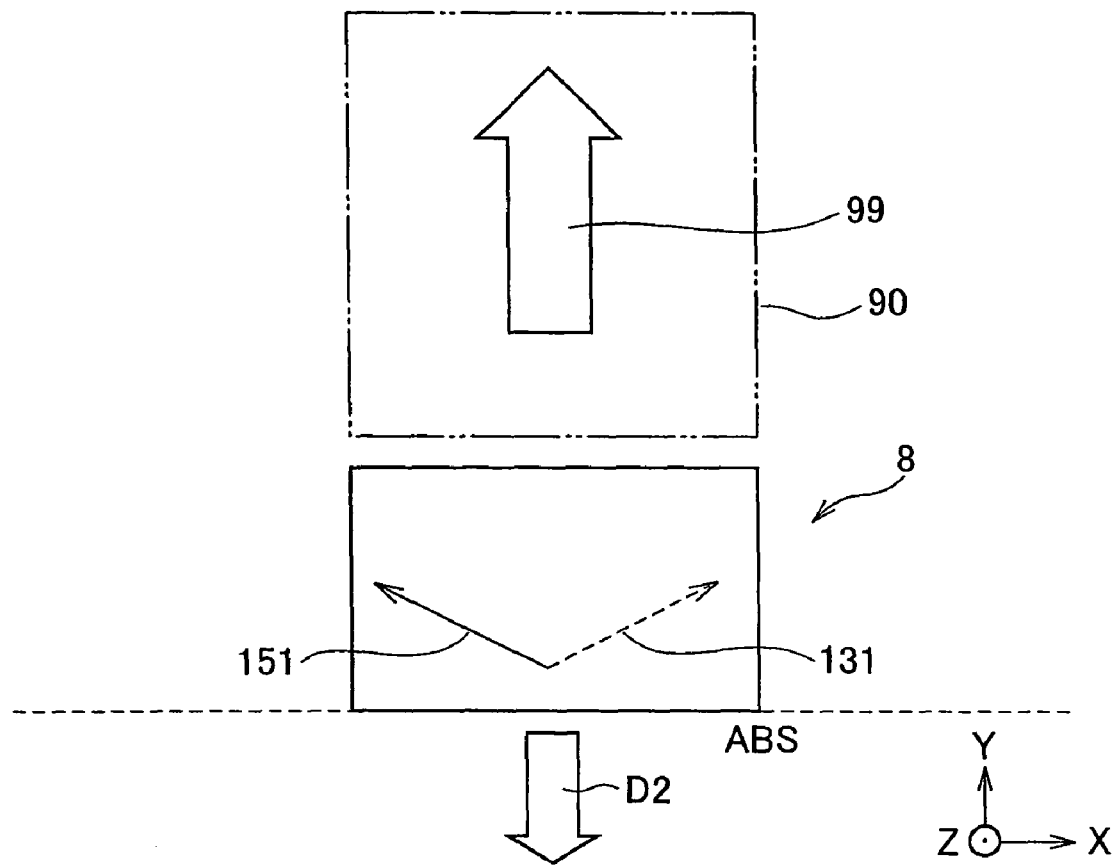
FIG. 6 is a top plan view in the X-Y plane of FIG. 2, and shows a model of the magnetic state change to obtain the MR change of the MR element in relation to the external magnetic field.

In contrast, as shown in FIG. 6, when an external magnetic field D2, which flows in a direction that is away from the ABS, is detected, the magnetization direction 131 of the first ferromagnetic layer 30 and the magnetization direction 151 of the second ferromagnetic layer 50 tend to rotate in directions opposite each other, and the resistance of the element is increased.

A series of resistance changes is measured according to the external magnetic field as described above. As a result, the external magnetic field is detected.

Additionally, to obtain an appropriate orthogonal direction for the magnetization directions 131 and 151 as shown in FIG. 4 as the initial positions, adjusting for example an intensity of a magnetic field of the orthogonal bias magnet 90, or adjusting the rotatability of the magnetization directions for the ferromagnetic layer 30 and 50 as a free layer, may be performed.

It is not necessary that the magnetization direction of the orthogonal bias magnet 90 be in an "ABS IN Magnetization" direction. The direction may be in an "ABS OUT Magnetization" direction which has a 180° reverse magnetization direction relative to that of the "ABS IN Magnetization" direction. In other words, the orthogonal bias magnet 90 is also magnetized in the other Y direction that is directed from the rear side to the ABS (or the opposite surface of the medium).

[Method for Orienting Magnetization Directions 131 and 151 of Magnetic Layers 30 and 50 Antiparallel and in Opposite Directions to Each Other]

As shown in FIGS. 2 and 3, it is very important that the magnetization directions of the two free layers 30 and 50 are antiparallel along the track width direction for the element function before the orthogonal bias magnet is activated (a state where the bias is not applied). Embodiments of this state are described below.

First Exemplary Embodiment

Before the bias magnetic field from the orthogonal bias magnet 90 (the layered structure 90) is applied, the first ferromagnetic layer 30 and the second ferromagnetic layer 50 are exchange-coupled through the nonmagnetic intermediate layer 40 such that the magnetization directions of the first ferromagnetic layer 30 and the second ferromagnetic layer 50 are antiparallel to each other. The state described above is the first exemplary state.

Figure 7:
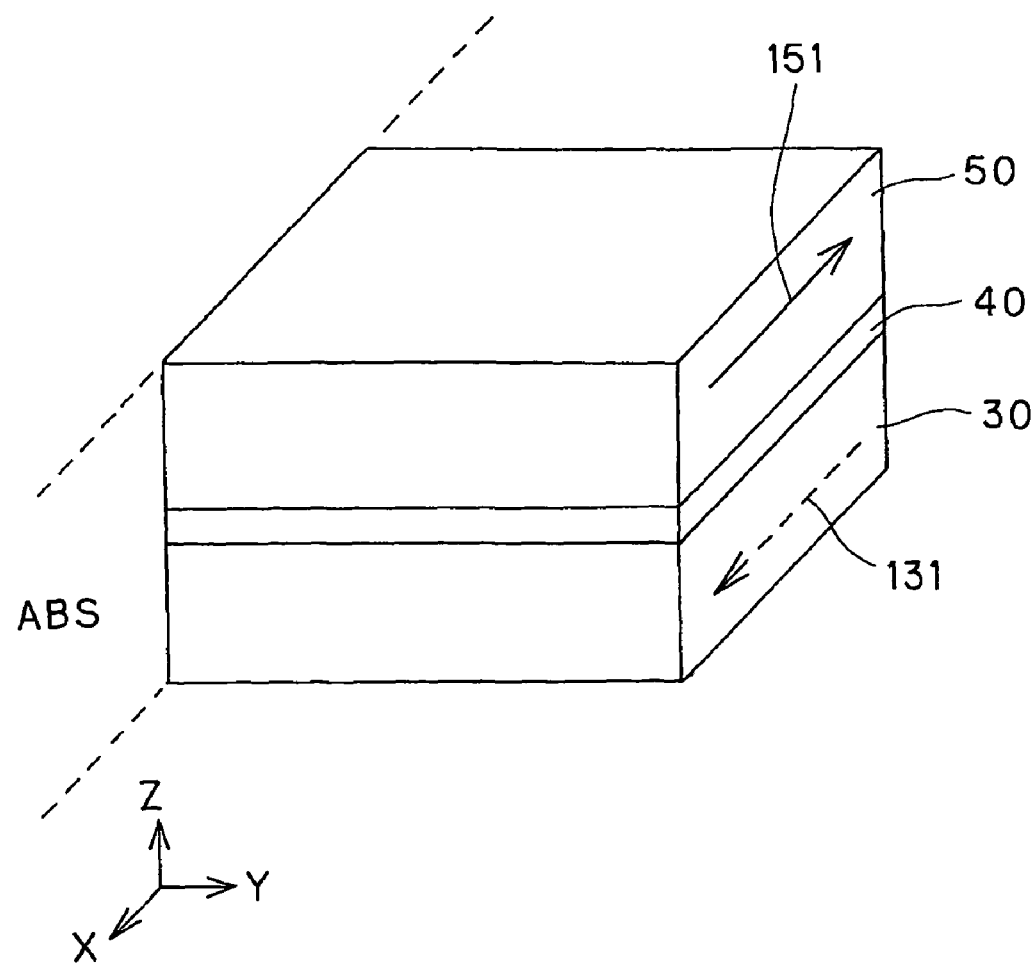
FIG. 7 is a perspective view showing an exchange-coupling of the first ferromagnetic layer and the second ferromagnetic layer through the nonmagnetic intermediate layer where the magnetic fields of the first and second ferromagnetic layers are antiparallel to each other.

This state is shown in FIG. 7, and the magnetization direction 131 of the first ferromagnetic layer 30 and the magnetization direction 151 of the second ferromagnetic layer 50 are exchange-coupled through the nonmagnetic intermediate layer 40, and are antiparallel to each other.

Materials for the first ferromagnetic layer 30 and the second ferromagnetic layer 50 are, for example, NiFe, CoFe, CoFeB, CoFeNi, $CO_2MnSi$, $CO_2MnGe$, $FeO_x$ (iron oxide), and $CoO_x$ (cobalt oxide). The thickness of each layer is about 0.5-8 nm.

These layers function as a free layer of which a magnetization direction changes due to the influence of a magnetic field applied from outside.

Materials for the nonmagnetic intermediate layer 40 are, for example, Ru, Ir, Rh, Cr, Cu, Zn, Ga, ZnO, InO, SnO, GaN, and ITO (indium tin oxide).

The thickness of the nonmagnetic intermediate layer is about 0.5-5 nm. There are restrictions on materials and thicknesses of the nonmagnetic intermediate layer 40 that is used for the antiferromagnetic coupling of the two ferromagnetic layers 30 and 50 (free layers).

Second Exemplary Embodiment

Figure 8:
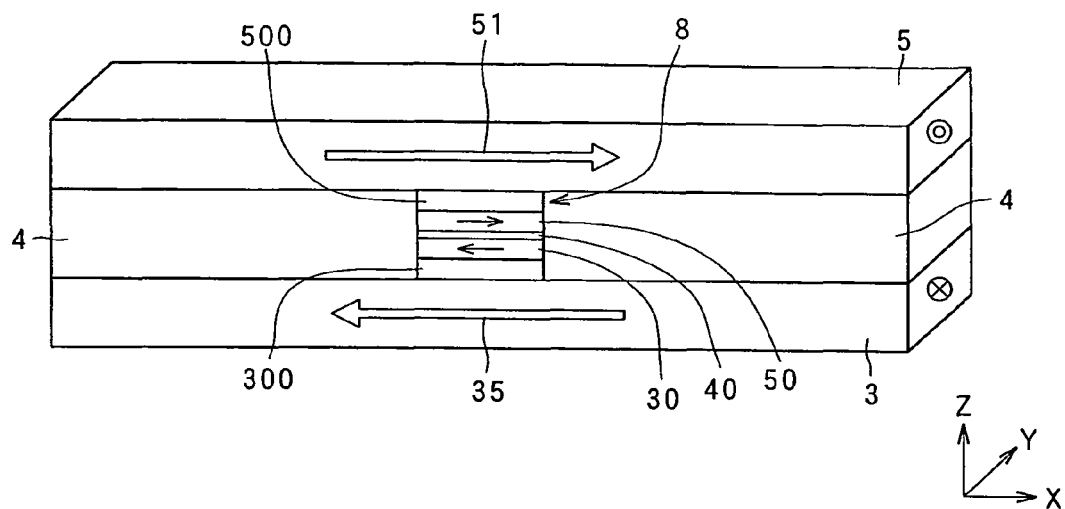
FIG. 8 is a perspective view of the MR element seen from an air bearing surface (ABS).

As shown in FIG. 8, an MR element includes an MR portion 8, and a first shield layer 3 (also referred to as a lower shield layer 3) and a second shield layer 5 (also referred to as an upper shield layer), which substantially sandwich the MR portion 8. The MR element has the current perpendicular to plane (CPP) structure in which a sense current is applied in a laminated direction of the MR portion 8.

Magnetization directions of the first shield layer 3 and the second shield layer 5 are each controlled by a magnetization direction controller. In one embodiment shown in FIG. 8, the magnetization direction 35 of the first shield layer 3 is fixed where the direction is in a negative width direction (−X direction), from the right side to the left side on the drawing. The magnetization direction 51 of the second shield layer 5 is fixed where the direction is in a positive width direction (+X direction), from the left side to the right side on the drawing. Preferably, the first shield layer 3 and the second shield layer 5 are provided as a single magnetic domain by the magnetization direction control means.

The MR portion 8 includes the nonmagnetic intermediate layer 40, and the first ferromagnetic layer 30 and the second ferromagnetic layer 50 that are provided to sandwich the nonmagnetic intermediate layer 40. A layered structure configured of the first ferromagnetic layer 30, the nonmagnetic intermediate layer 40, and the second ferromagnetic layer 50 is a sensor area. The total thickness of the layered structure is about 10-20 nm.

The magnetization directions of the first ferromagnetic layer 30 and the second ferromagnetic layer 50 are changed with respect to an external magnetic field; namely they function as free layers.

The magnetization directions of the first ferromagnetic layer 30 and the second ferromagnetic layer 50 are influenced by the magnetic functions of the first shield layer 3 and the second shield layer 5, respectively, and are in opposite directions relative to each other to provide an antiparallel magnetization state. The reason why the antiparallel magnetization state is provided, is because, with respect to an element in commercial use, the magnetization directions of the first ferromagnetic layer 30 and the second ferromagnetic layer 50 are substantially oriented in an orthogonal direction by the application of the bias magnetic field from the orthogonal bias magnet 90 as described above.

In order to obtain the above antiparallel magnetization state, a first exchange-coupling function gap layer 300 is located between the first shield layer 3 and the first ferromagnetic layer 30, and a second exchange-coupling function gap layer 500 is between the second shield layer 5 and the second ferromagnetic layer 50. In other words, the first ferromagnetic layer 30 is indirectly magnetically coupled with the first shield layer 3, which has the controlled magnetization direction, through the first exchange-coupling function gap layer 300. The second ferromagnetic layer 50 is indirectly magnetic coupled with the second shield layer 5, which has the controlled magnetization direction, through the second exchange-coupling function gap layer 500.

Figure 9:
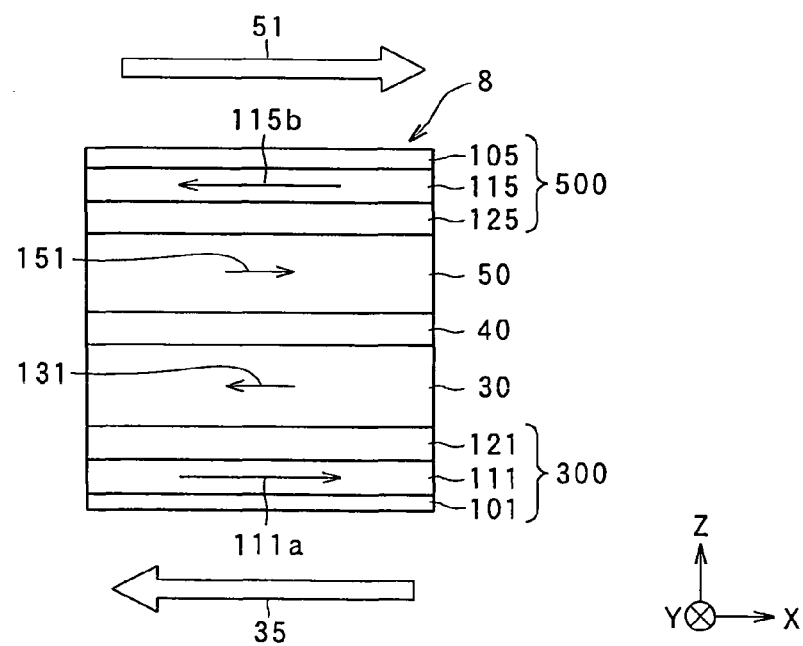
FIG. 9 is a schematic view showing the enlarged MR portion that includes a sensor area of the MR element.

A description of the first exchange-coupling function gap layer 300 according to one embodiment of the present invention is given below with reference to FIG. 9. However, it is noted that the structure is not limited to the explanation below.

The first exchange-coupling function gap layer 300 is formed by an exchange-coupling transmitting layer 101, a gap adjustment layer 111, and an exchange-coupling coordination layer 121 from the side of the first shield layer 3. The gap adjustment layer 111 is made of a ferromagnetic material and is a ferromagnetic layer.

The exchange-coupling transmitting layer 101 is made of at least one material from the following group: Ru, Rh, Ir, Cr, Cu, Ag, Au, Pt, and Pd. The intensity of the magnetic coupling is controlled with the material selected from the above group and its thickness, wherein the magnetic coupling occurs between the magnetization 35 of the first shield layer 3 and the magnetization 111a of the gap adjustment layer 111. A magnetization direction of the magnetization 111a of the gap adjustment layer 111, which is magnetic coupled with the magnetization 35 of the first shield layer 3, is decided by the setting of the selection of the material and its thicknesses. In other words, it is decided whether the magnetic coupling is antiferromagnetical (where the magnetization directions are in an opposite direction relationship with each other) or ferromagnetical (where the magnetization directions are in a same direction relationship with each other) by the setting of the selection of the material and its thicknesses.

The exchange-coupling coordination layer 121 is made of at least one material from the following group: Ru, Rh, Ir, Cr, Cu, Ag, Au, Pt, and Pd. The exchange-coupling coordination layer 121 controls the intensity of the magnetic coupling between the magnetization 111a of the gap adjustment layer 111 and the magnetization 131 of the first ferromagnetic layer 30 with the material selected from the above group and its thickness. A magnetization direction of the magnetization 131 of the first ferromagnetic layer 30, which is magnetically coupled with the magnetization 111a of the gap adjustment layer 111, is decided by the setting of the selected material and its thickness. In other words, it is decided whether the magnetic coupling is antiferromagnetical or ferromagnetical.

The thickness of the first exchange-coupling function gap layer 300 is about 1.5-6.0 nm.

Similarly, a description of the second exchange-coupling function gap layer 500 according to one embodiment of the present invention is given below with reference to FIG. 9. However, the structure is not limited to the explanation below.

The second exchange-coupling function gap layer 500 includes an exchange-coupling transmitting layer 105, a gap adjustment layer 115, and an exchange-coupling coordination layer 125 in an order from the side of the second shield layer 5. The gap adjustment layer 115 is made of a ferromagnetic material and is a ferromagnetic layer.

The exchange-coupling transmitting layer 105 is made of at least one material from the following group: Ru, Rh, Ir, Cr, Cu, Ag, Au, Pt, and Pd. The intensity of the magnetic coupling between the magnetization 51 of the second shield layer 5 and the magnetization 115b of the gap adjustment layer 115 is controlled by the material selected from the above group and its thickness. A magnetization direction of the magnetization 115b of the gap adjustment layer 115, which is magnetically coupled with the magnetization 51 of the second shield layer 5, is decided by the setting of the selected material and its thickness. In other words, it is decided whether the magnetic coupling is antiferromagnetic, where the magnetization directions are in an opposite direction relationship with each other, or is ferromagnetical, where the magnetization directions are in a same direction relationship with each other.

The exchange-coupling coordination layer 125 is made of at least one material from the following group: Ru, Rh, Ir, Cr, Cu, Ag, Au, Pt, and Pd. The intensity of the magnetic coupling between the magnetization 115b of the gap adjustment layer 115 and the magnetization 151 of the second ferromagnetic layer 50 is controlled by the material selected from the above group and its thickness. A magnetization direction of the magnetization 151 of the second ferromagnetic layer 50, which is magnetically coupled with the magnetization 115b of the gap adjustment layer 115, is decided by the setting of the selected material and its thickness. In other words, it is decided whether the magnetic coupling is antiferromagnetical or ferromagnetical.

The thickness of the second exchange-coupling function gap layer 500 is about 1.5-6.0 nm.

The layer identified by reference numeral 4 in the drawing is an insulating layer.

Third Exemplar Embodiment

Figure 10:
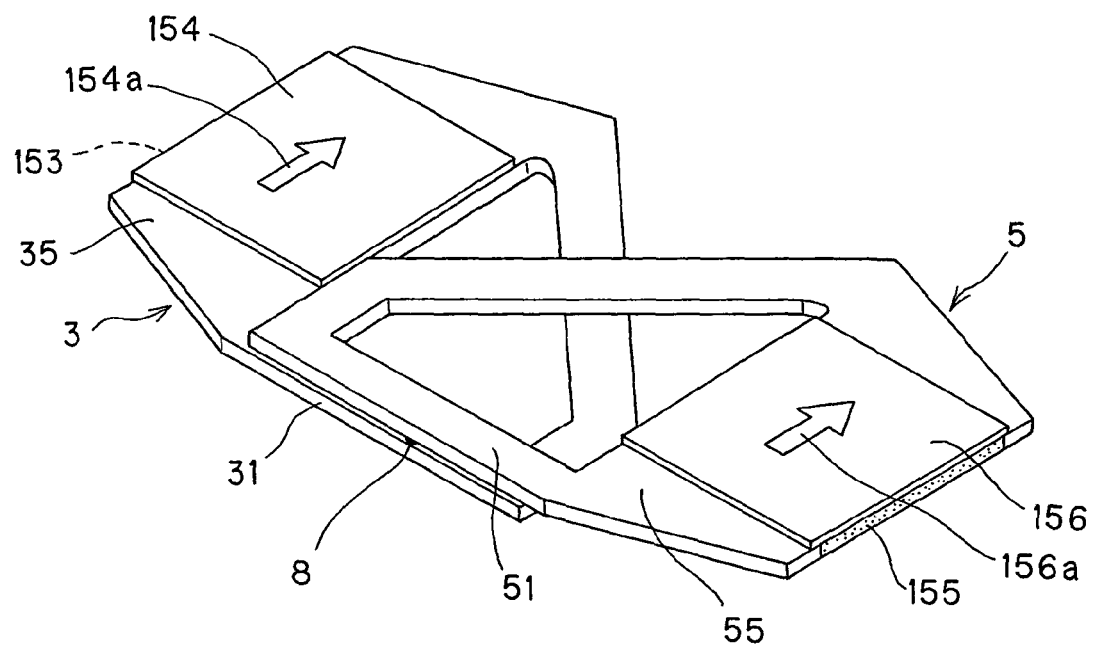
FIG. 10 is a perspective view of another embodiment that is a further developed structure of the first shield layer and the second shield layer.

The further development of the structure of the first shield layer 3 and the second shield layer 5 in the second exemplary embodiment described above is the third exemplary embodiment as shown in FIG. 10.

As shown in FIG. 10, the first shield layer 3 that is formed above the MR portion 8 and the second shield layer 5 that is formed below the MR portion 8 are provided in a frame structure (X-Y plane) that is respectively determined with a width and length of the element.

The frame structures of the first shield layer and the second shield layer respectively includes front frame portions 31, 51 that are provided at the ABS side (or the front side) and in the vicinity of the MR element 8, and side frame portions 35, 55 that are provided in the sides of the location from the edge portions of the front frame portions 31, 51 toward the rear sides.

Figure 11:
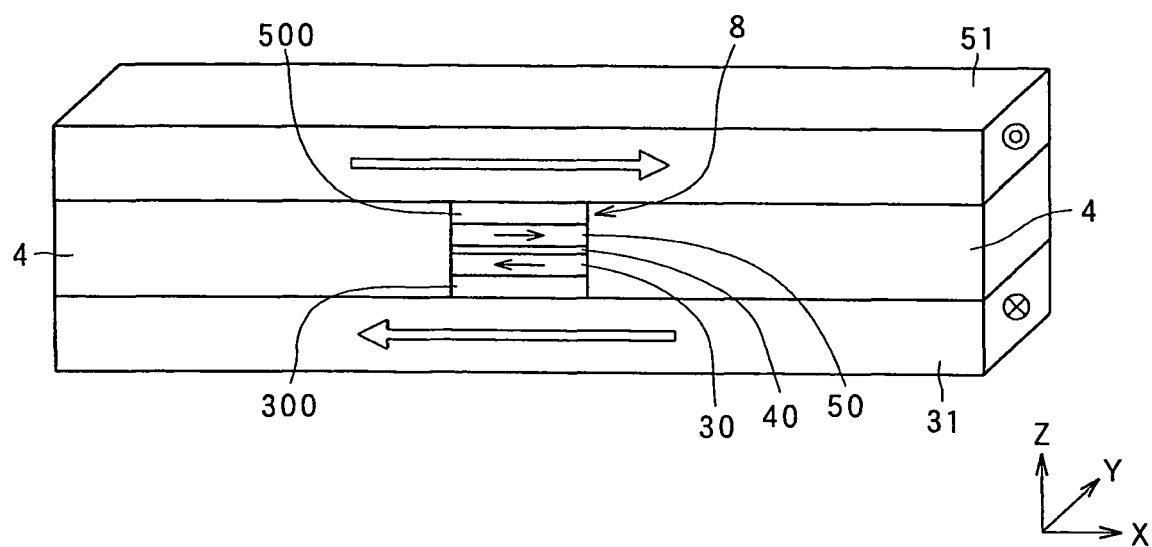
FIG. 11 is a perspective view showing a vicinity of a front frame structure in which the MR portion is provided at the ABS side in FIG. 10.

As shown in FIG. 11, the first ferromagnetic layer 30 and the second ferromagnetic layer 50, which form the MR portion 8, are configured such that the magnetization directions of the layers 30 and 50 are antiparallel. Namely the magnetization directions are opposite to each other due to the magnetic influence of the front frame portion 31 of the first shield layer 3 and the front frame portion 51 of the second shield layer 5.

As shown in FIG. 10, the side frame portion 35 of the first shield layer 3 has a combination portion of a first nonmagnetic gap layer 153 and a first bias magnetic field application layer 154. The first nonmagnetic gap layer 153 is configured to efficiently transfer the magnetic flux 154a that is generated by the first bias magnetic field application layer 154 to the side of the front frame portion 31 of the first shield layer 3. The combination portion of the first nonmagnetic gap layer 153 and the first bias magnetic field application layer 154 is configured to form a closed magnetic path in which a magnetic flux flows around an entire frame of the first shield layer 3, and is configured to make the magnetization of the front frame portion 31 of the first shield layer 3 a single magnetic domain and to control its magnetization direction.

Similarly, the side frame portion 55 of the second shield layer 5 partially has a combination portion of a second nonmagnetic gap layer 155 and a second bias magnetic field application layer 156. The second nonmagnetic gap layer 155 is configured to efficiently transfer the magnetic flux 156a from the second bias magnetic field application layer 156 to the front frame portion 51 of the second shield layer 5. The combination portion of the second nonmagnetic gap layer 155 and the second bias magnetic field application layer 156 is provided to form a closed magnetic path in which a magnetic flux flows around an entire frame of the second shield layer 5, and is configured to make the magnetization of the front frame portion 51 of the second shield layer 5 a single magnetic domain and to control its magnetization direction.

The structure of the MR portion 8 is same as the second exemplary embodiment described above.

As shown in FIG. 11, the first ferromagnetic layer 30, which forms the MR portion 8, is indirectly magnetically coupled with the first shield layer 3, which has the controlled magnetization direction, through the first exchange-coupling function gap layer 300.

The second ferromagnetic layer 50, which forms the MR portion 8, is indirectly magnetically coupled with the second shield layer 5, which has the controlled magnetization direction, through the second exchange-coupling function gap layer 500.

The structures of the first exchange-coupling function gap layer 300 and the second exchange-coupling function gap layer 500 in this embodiment are provided in the same manner as those described in the second exemplary embodiment.

Fourth Exemplary Embodiment

Figure 12:
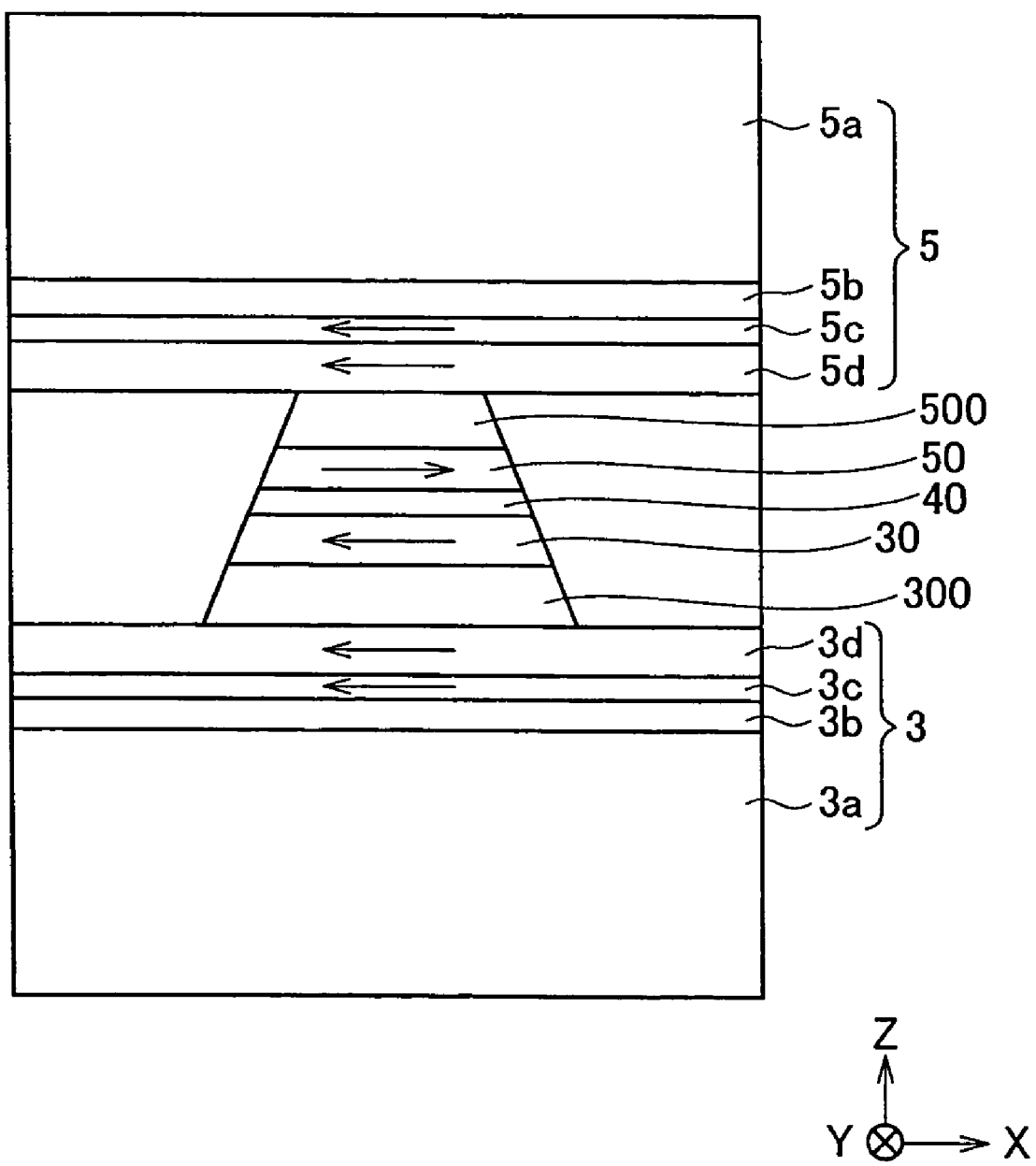
FIG. 12 is a sectional view seen from the ABS which illustrates an element configured to utilize a magnetization of a part of the shield layer that is pin-controlled by the antiferromagnetic layer in order to align the magnetic fields of the first and second ferromagnetic layers that function as a free layer in antiparallel directions.

The fourth exemplary embodiment provided in FIG. 12 utilizes the magnetic field of a part of the shield layer that is pinned controlled by the antiferromagnetic layer in order to align the magnetic fields of the first ferromagnetic layer 30 and the second ferromagnetic layers 50 in an antiparallel orientation as free layers.

As shown in FIG. 12, the first shield layer 3 is configured to form, from the lower side to the upper side, for example, the following layered structure: a main shield layer (3a) of NiFe with a layer thickness of 1,000-2,000 nm/an antiferromagnetic layer (3b) of IrMn with a layer thickness of 6 nm/a magnetic field application layer with a layered structure of a CoFe layer (3c) with a layer thickness of 1.5 nm and a NiFe layer (3d) with a layer thickness of 20 nm. The second shield layer 5 is configured to form, from the upper side to the lower side, for example, the following layered structure: a main shield layer (5a) of NiFe with a layer thickness of 1,000-2,000 nm/an antiferromagnetic layer (5b) of IrMn with a layer thickness of 6 nm/a magnetic field application layer with a layered structure of a CoFe layer (5c) with a layer thickness of 1.5 nm and a NiFe layer (5d) with a layer thickness of 20 nm.

Since the first shield layer 3 and the second shield layer 5 described above sandwich the MR portion 8 through the first exchange-coupling function gap layer 300 and the second exchange-coupling function gap layer 500, respectively, the magnetization directions of the first ferromagnetic layer 30 and the second ferromagnetic layer 50 are antiparallel to each other.

The above mentioned MR element is generally used as a sensor for reading magnetic information of a thin film magnetic head after wafer processing is completed. A description of the overall structure of the thin film magnetic head comprising the MR element is briefly given below.

[Explanation of Overall Structure of Thin Film Magnetic Head]

Figure 13:
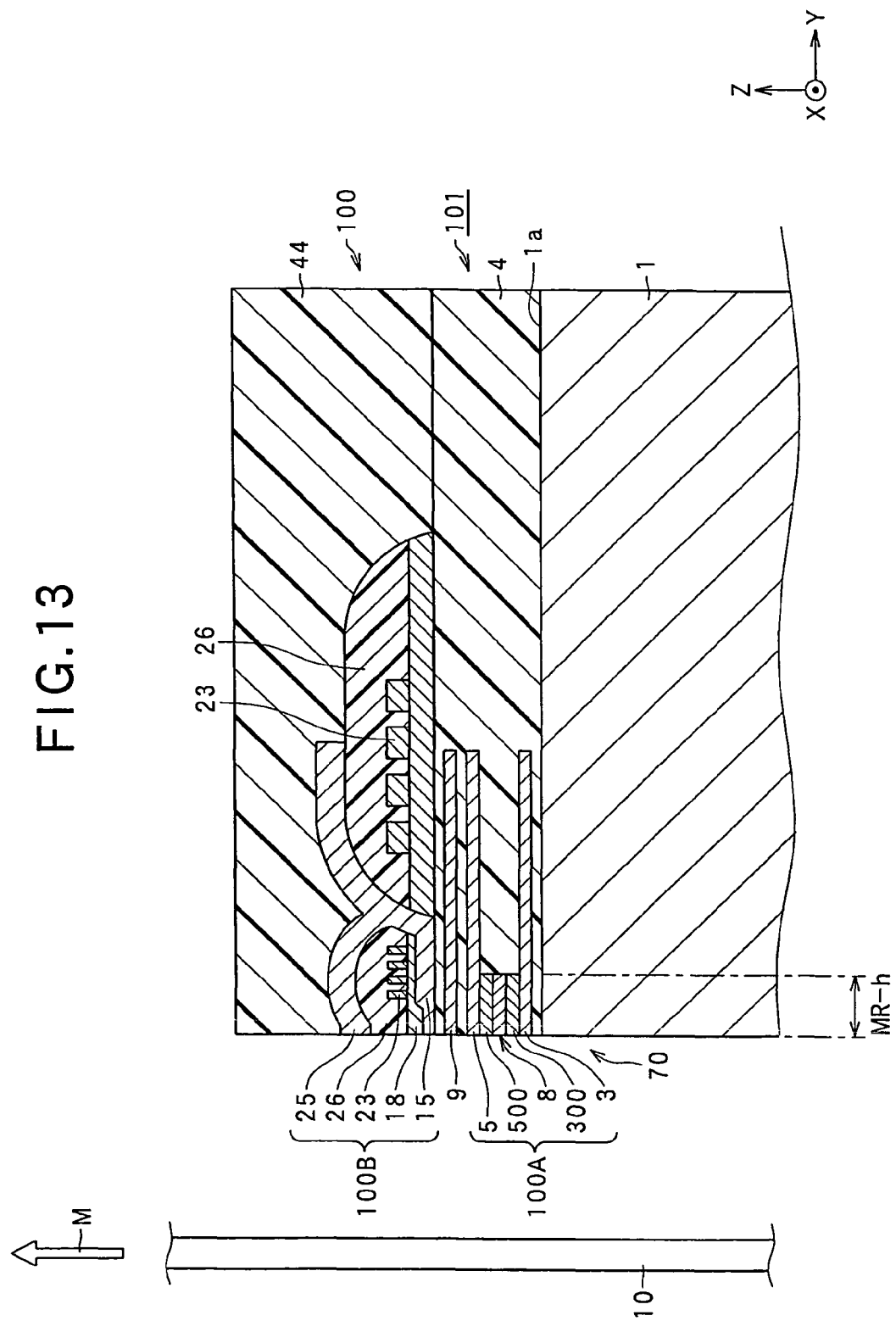
FIG. 13 is a sectional view of the thin film magnetic head that is parallel to the so-called ABS.

FIG. 13 shows a sectional view (i.e., a cross section taken through the Y-Z plane) of a thin film magnetic head in parallel with the so-called air bearing surface (ABS).

A thin film magnetic head 100 as shown in FIG. 13 is mounted on a magnetic recording device such as a hard disk drive in order to magnetically process a recording medium 10 such as a hard disk that moves in the medium traveling direction M.

The thin film magnetic head 100 as exemplified in the drawing is a so-called complex type head that is executable for both recording processing and reproducing processing as magnetic processing. As shown in FIG. 13, it has a structure of a magnetic head part 101 formed on a slider substrate 1 structured of ceramic material such as ALTIC ($Al_2O_3.TiC$).

A magnetic head part 101 has a laminated constitution of a reproducing head part 100A for reproducing magnetic information recorded using the MR and, for example, a shield type recording head part 100B for executing the recording processing of the perpendicular recording system.

A description is given below in more detail.

A first shield layer 3 and a second shield layer 5 are flat layers formed in a manner of being substantially parallel to the side surface 1a of the slider substrate 1. These layers 3 and 5 form a part of the ABS that is the medium-opposed surface 70.

An MR portion 8 is sandwiched between the first shield layer 3 and the second shield layer 5 and forms part of the medium-opposed surface 70. A height perpendicular to the medium-opposed surface 70 (i.e., in the Y direction) is an MR height (MR-h).

The first shield layer 3 and the second shield layer 5 are formed by a pattern plating method including a frame plating method, for example. Although it is not clearly shown in the drawing, the first shield layer 3 and the second shield layer 5 need to be structured in such a way as to demonstrate the above-mentioned effect of the present invention.

The MR portion 8 is a laminated layer substantially parallel to the side surface 1a of the slider substrate 1, and forms a part of the medium-opposed surface 70.

The MR portion 8 is a current perpendicular type (CPP) layered film in which a sense current flows in the direction perpendicular to the laminating surface and has a configuration as described above.

Moreover, as shown in FIG. 13, an interelement shield layer 9 made of the same material as that of the second shield layer 5 is formed between the second shield layer 5 and the recording head part 10B.

The interelement layer 9 functions in a manner of shielding the MR element 8 that functions as a sensor from a magnetic field generated by the recording head part 100B, thereby blocking exogenous noises at the time of reading. A bucking coil part may also be formed between the interelement layer 9 and the recording head part 100B. The bucking coil part is to generate magnetic flux that overrides a magnetic flux loop that is generated by the recording head part 100B and passes through the upper and lower electrode layers of the MR element 8 and, therefore, acts in a manner of suppressing unnecessary writing to a magnetic disk or wide area adjacent tracks erasing (WATE) phenomena that are erasing operations.

Insulating layers 4 and 44 made of alumina, etc. are formed in the following: i) in a gap between the first shield layer 3 and the second shield layer 5 on the side opposite to the medium-opposed surface 70 of the MR element 8; ii) in a rear (posterior) region between the first and second shield layers 3 and 5 and the interelement shield layer 9, the rear region being on the side opposite to the medium-opposed surface 70; iii) in a gap between the first shield layer 3 and the slider substrate 1; and iv) in a gap between the interelement shield layer 9 and the recording head part 100B.

The recording head part 100B is preferably structured for perpendicular magnetic recording and, as shown in FIG. 13, has a main magnetic pole layer 15, a gap layer 18, a coil insulating layer 26, a coil layer 23 and an auxiliary magnetic pole layer 25.

The main magnetic pole layer 15 is structured to be a leading magnetic path for leading and focusing magnetic flux initiated by the coil layer 23 to the recording layer of a magnetic recording medium 10 to be written. It is preferred that the end part of the main magnetic pole layer 15 on the side of the medium-opposed surface 70 should be smaller in thickness compared with other portions in the track width direction (i.e., the direction along the X-axis in FIG. 13) and in the laminating direction (i.e., the direction along the Z-axis in FIG. 13). As a result, it is possible to generate a magnetic field for minute and strong writing corresponding to high recording density.

On the end part of the auxiliary magnetic pole layer 25 magnetically coupled with the main magnetic pole layer 15 on the side of the medium-opposed surface 70 is formed a trailing shield part that has a wider layer cross section than the other portions of the auxiliary magnetic layer 25. As shown in FIG. 13, the auxiliary magnetic pole layer 25 is disposed in a manner of being opposed to the end part of the main magnetic pole layer 15 on the side of the medium-opposed surface 70 via the gap layer made of insulating material such as alumina and the coil insulating layer 26.

The provision of the auxiliary magnetic pole layer 25 allows making the magnetic field gradient steep between the auxiliary magnetic pole layer 25 and the main magnetic pole layer 15 in the vicinity of the medium-opposed surface 70. As a result, jitter is reduced in a signal output, thereby making the error rate smaller at the time of reading.

The auxiliary magnetic pole layer 25 is formed for example, to about 0.5~5 μm in thickness by a frame plating method, a sputtering method or the like. The material may be an alloy made of two or three elements selected from the group consisting of Ni, Fe and Co, for example, or an alloy made of these elements, as main components, along with predetermined chemical elements.

The gap layer 18 is formed to separate the coil layer 23 from the main magnetic pole layer 15. The gap layer 18 may be formed by a sputtering method, a CVD method or the like, for example, have a thickness of about 0.01~0.5 μm and be structured of $Al_2O_3$, diamond-like carbon (DLC) or the like.

In the embodiment, it is explained that a thin film magnetic head has a structure of a reproducing head part formed on the base substrate side and a perpendicular recording head part layered thereon. However, the layering order may be reversed. Moreover, the configuration may be such that only a reproducing part is provided in the case of a reproduction-only thin film head.

[Explanation of Head Gimbal Assembly and Hard Disk Device]

Next, a head gimbal assembly on which the above mentioned thin film head is mounted and one embodiment of a hard disk device are described below.

Figure 14:
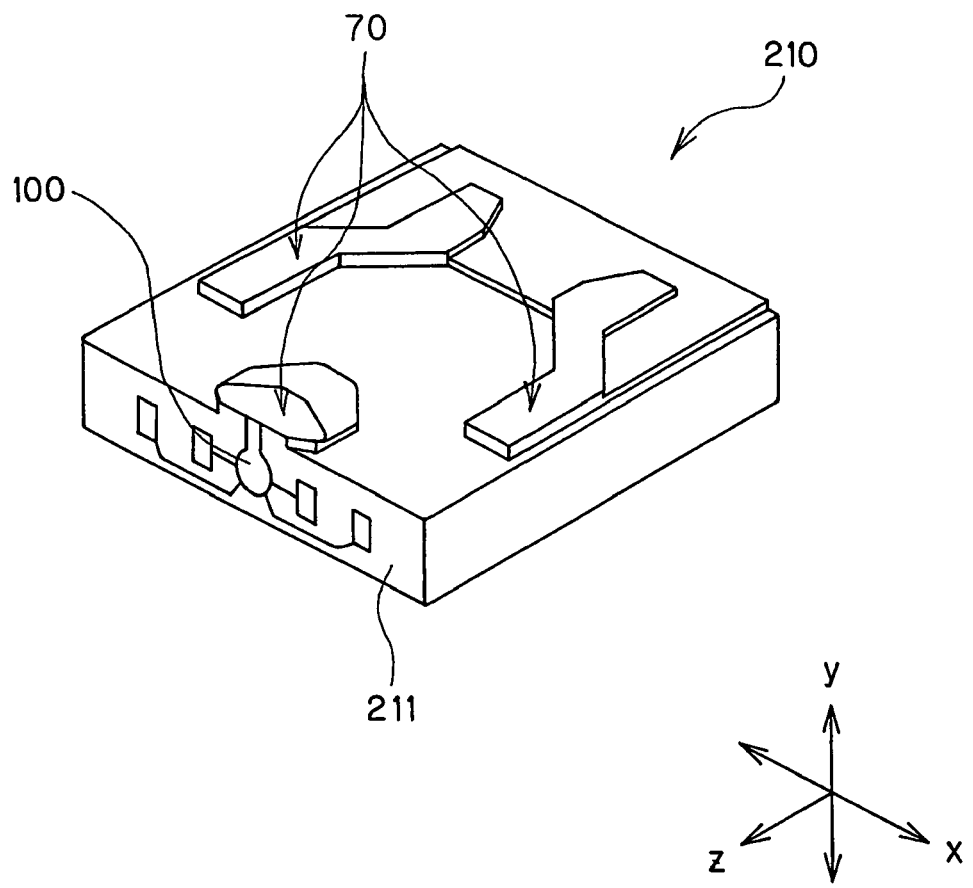
FIG. 14 is a perspective view of the slider that is assembled into a head gimbal assembly according to one embodiment of the present invention.

First, a description of a slider 210 equipped with the head gimbal assembly is illustrated in FIG. 14. In the hard disk device, the slider 210 is disposed in a manner of being opposed to a hard disk that is a rotatably driven disk-like recording medium. The slider 210 is provided with a base substrate 211 mainly configured of a substrate and an overcoat.

The base substrate 211 is substantially hexahedronal. Of the six surfaces of the base substrate 211, one surface is disposed in a manner of being opposed to a hard disk. The medium-opposed surface 70 is formed on the surface.

When a hard disk is rotated in the z direction in FIG. 14, an airflow passing between the hard disk and the slider 210 creates lifting power downwardly in the Y direction in FIG. 14. The slider 210 floats from the surface of the hard disk by this lifting power. The X direction in FIG. 14 is the track traversing direction of the hard disk.

In the vicinity of the end part of the slider 210 on the air exit side (i.e., the end part on the lower left in FIG. 14), the thin film magnetic head according to the present embodiment is formed.

Figure 15:
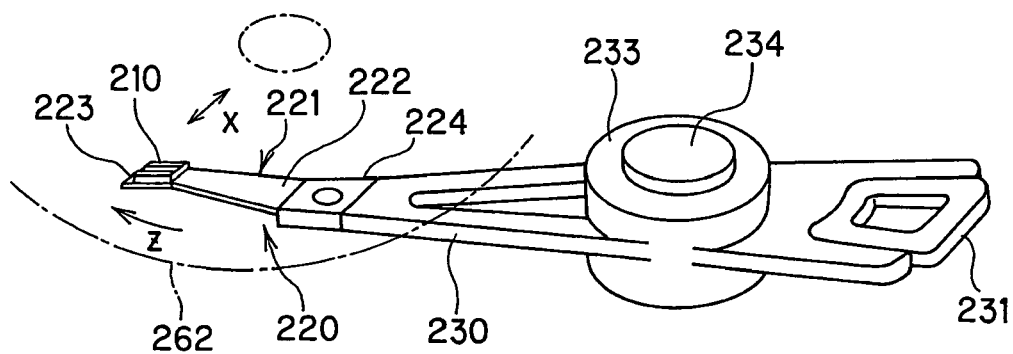
FIG. 15 is a perspective view of a head arm assembly that includes the head gimbal assembly according to one embodiment of the present invention.

Next, a description of the head gimbal assembly 220 according to the present embodiment is described by referring to FIG. 15. The head gimbal assembly 220 is provided with the slider 210 and a suspension 221 for elastically supporting the slider 210. The suspension 221 has a plate spring load beam 222 formed of stainless steel, a flexure 223 that is provided on one end part of the load beam 222 and joined with the slider 210 in a manner of giving the slider 210 a proper degree of freedom, and a base plate 224 provided on the other end part of the load beam 222.

The base plate 224 is mounted on an arm 230 of an actuator for moving the slider 210 in the track traversing direction x of the hard disk 262. The actuator has the arm 230 and a voice coil motor for driving the arm 230. A gimbal part is provided for keeping a posture of the slider 210 constant on the portion of the flexure 223 on which the slider 210 is mounted.

The head gimbal assembly 220 is mounted on the arm 230 of the actuator. One arm 230 with a head gimbal assembly 220 mounted thereon is called a head arm assembly. A carriage having multiple arms, each of which has a head gimbal assembly mounted thereon, is called a head stack assembly.

FIG. 15 shows one embodiment of a head arm assembly. In this head arm assembly, a head gimbal assembly 220 is mounted on one end part of the arm 230. A coil 231, part of a voice coil motor, is mounted on the other end part of the arm 230. A bearing part 233 is provided in the middle part of the arm 230 so that a shaft 234 is rotatably supported.

Figure 16:
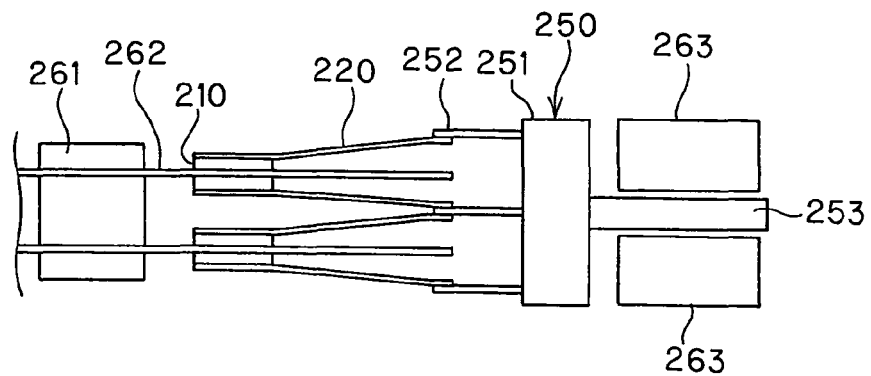
FIG. 16 is a schematic view of a main part of a magnetic disk device according to one embodiment of the present invention.
Figure 17:
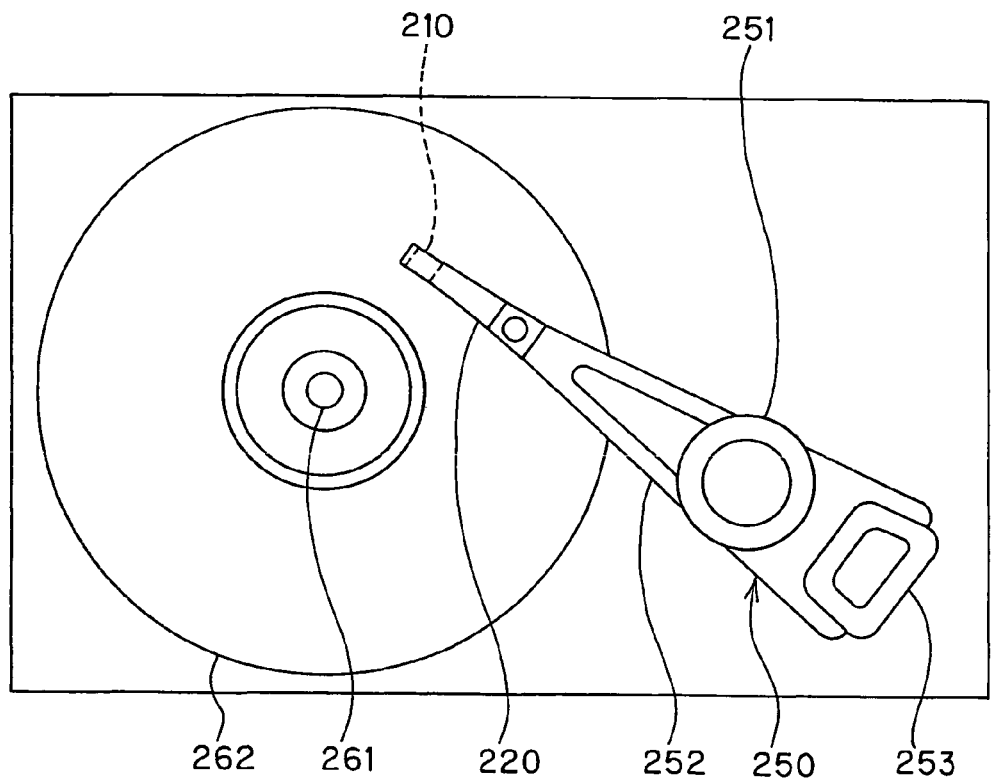
FIG. 17 is a plan view of the magnetic disk device according to one embodiment of the present invention.

A description of one example of the head stack assembly and the hard disk device according to the present embodiment is described by referring to FIG. 16 and FIG. 17.

FIG. 16 is an explanatory view illustrating the main part of a hard disk device. FIG. 17 is a plan view of the hard disk device.

The head stack assembly 250 has a carriage 251 having multiple arms 252. On the multiple arms 252 are mounted multiple head gimbal assemblies 220 in the perpendicular direction at certain intervals. A coil 253, part of a voice coil motor, is mounted on the opposite side of the arms 252 in the carriage 251. The head stack assembly 250 is incorporated into a hard disk device.

A hard disk device has multiple hard disks 262 mounted on a spindle motor 261. Two sliders 210 are disposed for each hard disk 262 in a manner of being opposed to each other by sandwiching the hard disk 262. The voice coil motor has permanent magnets 263 disposed in a manner of being opposed to each other by sandwiching the coil 253 of the head stack assembly 250.

The head stack assembly 250 and an actuator except for sliders 210 support as well as locate the slider relative to the hard disk 22 corresponding to a positioning device of the present invention.

In the hard disk device according to the present embodiment, an actuator allows moving sliders 210 in the track traversing direction of the hard disk 262 in order to position sliders 210 relative to the hard disk 262. Thin film magnetic heads included in sliders 210 record information on the hard disk 262 by the recording head and reproduce (or read) information recorded in the hard disk 262 by the reproducing head.

The head gimbal assembly and hard disk device according to the present embodiment are as effective as the thin film magnetic head according to the above-mentioned embodiment.

Exemplary Embodiments of Specific Experiments

A description of a layered structure with a FePt magnetic layer according to one embodiment of the present invention is given below with specific experiments.

Experiment I

A base layer, which has composition and layer thickness shown in Table 1, is formed on an ALTIC substrate by a DC sputter device, and then a FePt magnetic layer with the thickness of 35 nm is formed on the base layer. The FePt magnetic layer contains FePt that has 14 at % of Cu, and atomic ratio of Fe/Pt is one (1).

A Ta passivation layer with the thickness of 5 nm is further formed on the FePt magnetic layer. Then, an annealing process is conducted for 3 hours at a temperature of 250° C. in order to transform (crystal order) the FePt.

A coercive force Hc of the FePt magnetic layer is measured by a vibrating sample magnetometer (VSM) with respect to the layered structure samples that formed with the method described above. The results are shown in Table 1 below.

TABLE 1

|  | Composition of the Base layer (Thickness) | Coercive Force Hc (Oe) |
| --- | --- | --- |
| Comparison I-1* | — | 991 |
| Experiment I-1 | Ta (5 nm)/MgO (5 nm) | 6427 |
| Experiment I-2 | Ta (5 nm)/ZnO (5 nm) | 8285 |
| Comparison I-2* | MgO (5 nm) | 525 |
| Comparison I-3* | Al$_2$O$_3$ (5 nm) | 1233 |
| Comparison I-4* | ZnO (5 nm) | 1892 |
| Comparison I-5* | Ta (5 nm) | 705 |
| Comparison I-6* | Ta (5 nm)/Al$_2$O$_3$ (5 nm) | 1542 |

Ta (5 nm)/MgO (5 nm): Two layer base structure where MgO layer is formed on Ta layer
Ta (5 nm)/ZnO (5 nm): Two layer base structure where ZnO layer is formed on Ta layer
Ta (5 nm)/Al$_2$O$_3$ (5 nm): Two layer base structure where Al$_2$O$_3$ layer is formed on Ta layer Because of the results shown in the above Table 1, the samples of the present invention achieve a preferable order (transformation) of FePt at 250° C.

Experiment II

Under the same condition of the above experiment I, several samples are formed with annealing temperatures of (except for 250° C.) 100° C., 150° C., 200° C., 300° C., 350° C., 400° C., 450° C., 500° C., and 550° C., and similarly, the coercive force Hc is measured for each sample. The results are shown in Table 2 below.

TABLE 2

|  | Composition of the Base layer (Thickness) | Annealing Temperature (° C.) | Coercive Force Hc (Oe) |
| --- | --- | --- | --- |
| Comparison I-1*-1 | — | 100 | 533 |
| Comparison I-1*-2 | — | 150 | 521 |
| Comparison I-1*-3 | — | 200 | 532 |
| Comparison I-1* | — | 250 | 991 |
| Comparison I-1*-4 | — | 300 | 1623 |
| Comparison I-1*-5 | — | 350 | 3278 |
| Comparison I-1*-6 | — | 400 | 4876 |
| Comparison I-1*-7 | — | 450 | 9017 |
| Comparison I-1*-8 | — | 500 | 8976 |
| Comparison I-1*-9 | — | 550 | 8822 |
| Experiment I-1-1 | Ta (5 nm)/MgO (5 nm) | 100 | 520 |
| Experiment I-1-2 | Ta (5 nm)/MgO (5 nm) | 150 | 3652 |
| Experiment I-1-3 | Ta (5 nm)/MgO (5 nm) | 200 | 6023 |
| Experiment I-1 | Ta (5 nm)/MgO (5 nm) | 250 | 6427 |
| Experiment I-1-4 | Ta (5 nm)/MgO (5 nm) | 300 | 8112 |
| Experiment I-1-5 | Ta (5 nm)/MgO (5 nm) | 350 | 8133 |
| Experiment I-1-6 | Ta (5 nm)/MgO (5 nm) | 400 | 8137 |
| Experiment I-1-7 | Ta (5 nm)/MgO (5 nm) | 450 | 8156 |
| Experiment I-1-8 | Ta (5 nm)/MgO (5 nm) | 500 | 8213 |
| Experiment I-1-9 | Ta (5 nm)/MgO (5 nm) | 550 | 8222 |
| Experiment I-2-1 | Ta (5 nm)/ZnO (5 nm) | 100 | 821 |
| Experiment I-2-2 | Ta (5 nm)/ZnO (5 nm) | 150 | 2118 |
| Experiment I-2-3 | Ta (5 nm)/ZnO (5 nm) | 200 | 6131 |
| Experiment I-2 | Ta (5 nm)/ZnO (5 nm) | 250 | 8285 |
| Experiment I-2-4 | Ta (5 nm)/ZnO (5 nm) | 300 | 8313 |
| Experiment I-2-5 | Ta (5 nm)/ZnO (5 nm) | 350 | 8322 |
| Experiment I-2-6 | Ta (5 nm)/ZnO (5 nm) | 400 | 8327 |
| Experiment I-2-7 | Ta (5 nm)/ZnO (5 nm) | 450 | 8329 |
| Experiment I-2-8 | Ta (5 nm)/ZnO (5 nm) | 500 | 8322 |
| Experiment I-2-9 | Ta (5 nm)/ZnO (5 nm) | 550 | 8325 |
| Comparison I-2*-1 | MgO (5 nm) | 100 | 520 |
| Comparison I-2*-2 | MgO (5 nm) | 150 | 523 |
| Comparison I-2*-3 | MgO (5 nm) | 200 | 530 |
| Comparison I-2* | MgO (5 nm) | 250 | 525 |
| Comparison I-2*-4 | MgO (5 nm) | 300 | 1429 |
| Comparison I-2*-5 | MgO (5 nm) | 350 | 3722 |
| Comparison I-2*-6 | MgO (5 nm) | 400 | 6477 |
| Comparison I-2*-7 | MgO (5 nm) | 450 | 8211 |
| Comparison I-2*-8 | MgO (5 nm) | 500 | 8233 |
| Comparison I-2*-9 | MgO (5 nm) | 550 | 8222 |
| Comparison I-3*-1 | Al$_2$O$_3$ (5 nm) | 100 | 532 |
| Comparison I-3*-2 | Al$_2$O$_3$ (5 nm) | 150 | 525 |
| Comparison I-3*-3 | Al$_2$O$_3$ (5 nm) | 200 | 530 |
| Comparison I-3* | Al$_2$O$_3$ (5 nm) | 250 | 1233 |
| Comparison I-3*-4 | Al$_2$O$_3$ (5 nm) | 300 | 1843 |
| Comparison I-3*-5 | Al$_2$O$_3$ (5 nm) | 350 | 3096 |
| Comparison I-3*-6 | Al$_2$O$_3$ (5 nm) | 400 | 4497 |
| Comparison I-3*-7 | Al$_2$O$_3$ (5 nm) | 450 | 7662 |
| Comparison I-3*-8 | Al$_2$O$_3$ (5 nm) | 500 | 7677 |
| Comparison I-3*-9 | Al$_2$O$_3$ (5 nm) | 550 | 7689 |
| Comparison I-4*-1 | ZnO (5 nm) | 100 | 809 |
| Comparison I-4*-2 | ZnO (5 nm) | 150 | 813 |
| Comparison I-4*-3 | ZnO (5 nm) | 200 | 822 |
| Comparison I-4* | ZnO (5 nm) | 250 | 1892 |
| Comparison I-4*-4 | ZnO (5 nm) | 300 | 2219 |
| Comparison I-4*-5 | ZnO (5 nm) | 350 | 3345 |
| Comparison I-4*-6 | ZnO (5 nm) | 400 | 6238 |
| Comparison I-4*-7 | ZnO (5 nm) | 450 | 8333 |
| Comparison I-4*-8 | ZnO (5 nm) | 500 | 8313 |
| Comparison I-4*-9 | ZnO (5 nm) | 550 | 8327 |
| Comparison I-5*-1 | Ta (5 nm) | 100 | 671 |
| Comparison I-5*-2 | Ta (5 nm) | 150 | 665 |
| Comparison I-5*-3 | Ta (5 nm) | 200 | 672 |
| Comparison I-5* | Ta (5 nm) | 250 | 705 |
| Comparison I-5*-4 | Ta (5 nm) | 300 | 1799 |
| Comparison I-5*-5 | Ta (5 nm) | 350 | 4172 |
| Comparison I-5*-6 | Ta (5 nm) | 400 | 6393 |
| Comparison I-5*-7 | Ta (5 nm) | 450 | 9011 |
| Comparison I-5*-8 | Ta (5 nm) | 500 | 8923 |
| Comparison I-5*-9 | Ta (5 nm) | 550 | 8823 |
| Comparison I-6*-1 | Ta (5 nm)/Al$_2$O$_3$ (5 nm) | 100 | 533 |
| Comparison I-6*-2 | Ta (5 nm)/Al$_2$O$_3$ (5 nm) | 150 | 523 |
| Comparison I-6*-3 | Ta (5 nm)/Al$_2$O$_3$ (5 nm) | 200 | 914 |
| Comparison I-6* | Ta (5 nm)/Al$_2$O$_3$ (5 nm) | 250 | 1542 |
| Comparison I-6*-4 | Ta (5 nm)/Al$_2$O$_3$ (5 nm) | 300 | 1791 |
| Comparison I-6*-5 | Ta (5 nm)/Al$_2$O$_3$ (5 nm) | 350 | 3101 |
| Comparison I-6*-6 | Ta (5 nm)/Al$_2$O$_3$ (5 nm) | 400 | 4517 |
| Comparison I-6*-7 | Ta (5 nm)/Al$_2$O$_3$ (5 nm) | 450 | 7794 |
| Comparison I-6*-8 | Ta (5 nm)/Al$_2$O$_3$ (5 nm) | 500 | 7814 |
| Comparison I-6*-9 | Ta (5 nm)/Al$_2$O$_3$ (5 nm) | 550 | 7822 |

Because of the experiment results shown above, the samples of the present invention have remarkably superior results, the coercive force Hc is 6,000 Oe or more at an annealing temperature of 200-300° C., compared with other comparison samples.

On the contrary, the comparison samples do not have any results that show a coercive force Hc of the 6,000 Oe or over at an annealing temperature of 300° C. or lower.

It is understood that if the coercive force Hc is 6,000 Oe or over, the transformation or order(ed) of FePt is realized up to a substantially sufficient degree.

It is clear that the present invention has advantages and the desired effect as shown in the above experimental results.

The layered structure according to the present invention includes an amorphous Ta layer, a metallic oxide layer formed from one of zinc oxide (ZnO) and magnesium oxide (MgO) on the Ta layer, and a FePt magnetic layer formed on the metallic oxide layer. Therefore, an $L1_0$ structural FePt ordered alloy is obtained at a temperature of 300° C. or lower (especially, 200-300° C.).

Therefore, the layered structure maintains functions of a magnetic material portion of an element that has a maximum temperature limitation of 300° C. (especially, 200-300° C.).

As discussed above, it is understood that at or below the temperature of 300° C. (especially 200-300° C.), the comparison samples do not obtain an $L1_0$ structural FePt ordered alloy because the coercive force is extremely small.

With respect to possibilities of the industrial use of the present invention, the layered structure with the FePt magnetic layer according to the present invention is used, for example, as a hard magnet for a bias magnetic field application of an MR element, a microwave assist recording oscillation element, a next generation magnetic recording medium, and in the electronic device industries thereof.

What is claimed is:

1. A layered structure comprising:
   an amorphous tantalum (Ta) layer;
   a metallic oxide layer formed from zinc oxide (ZnO) on the Ta layer; and
   a FePt magnetic layer formed on the metallic oxide layer.

2. The layered structure according to claim 1, wherein the FePt magnetic layer comprises an $L1_0$ structural FePt ordered alloy as a main component.

3. The layered structure according to claim 1, wherein the FePt magnetic layer has a coercive force of 6,000 Oe or over as its material characteristic.

4. The layered structure according to claim 1, wherein the FePt magnetic layer is provided through an annealing process at a temperature of equal to or under 300° C. after the FePt magnetic layer is formed.

5. The layered structure according to claim 1, wherein the FePt magnetic layer is provided through an annealing process at a temperature between 200-300° C. after the FePt magnetic layer is formed.

6. The layered structure according to claim 1, wherein a layer thickness of the Ta layer is at least 2 nm, a layer thickness of the metallic oxide layer is at least 2 nm, and a layer thickness of the FePt magnetic layer is at least 10 nm.

7. The layered structure according to claim 1, wherein a layer thickness of the Ta layer is in a range of 2-10 nm, a layer thickness of the metallic oxide layer is in a range of 2-10 nm, and a layer thickness of the FePt magnetic layer is in a range of 10-50 nm.

8. The layered structure according to claim 1, wherein the FePt magnetic layer has at least 80 at % of a total amount of Fe and Pt atoms.

9. The layered structure according to claim 1, wherein the FePt magnetic layer has Cu as an additive, and a content of the Cu is 5-30 at %.

10. A magnetoresistive effect (MR) element comprising:
    a nonmagnetic intermediate layer;
    a magnetoresistive effect (MR) portion having a first ferromagnetic layer as a free layer and a second ferromagnetic layer as a free layer, the first ferromagnetic layer and the second ferromagnetic layer being laminated to sandwich the nonmagnetic intermediate layer, wherein
    the MR portion has a current perpendicular to plane (CPP) structure in which a sense current is applied in a laminated direction of the MR portion,
    an orthogonal bias magnet is provided at a rear portion of the MR portion where the orthogonal bias magnet has an influence to create a substantial orthogonal direction status of magnetization directions for the first ferromagnetic layer and the second ferromagnetic layer, and
    the orthogonal bias magnet has a layered structure according to claim 1.

11. A thin film magnetic head comprising:
    an air bearing surface (ABS) that is opposite to a recording medium;
    the MR element according to claim 10 that is provided in the vicinity of the ABS to detect a signal magnetic field from the recording medium; and
    a pair of electrodes that apply the electric current in the laminated direction of the MR element.

12. A head gimbal assembly comprising:
    the thin film magnetic head according to claim 11;
    a slider provided opposite to a recording medium; and
    a suspension elastically supporting the slider.

13. A magnetic disk device comprising:
    the thin film magnetic head according to claim 11;
    a slider provided opposite to a recording medium; and
    a positioning device supporting the slider and locating the position of the slider against the recording medium.

* * * * *